United States Patent [19]

Torihata et al.

[11] Patent Number: 4,761,547

[45] Date of Patent: Aug. 2, 1988

[54] SEMICONDUCTOR PHOTOELECTRIC CONVERSION DEVICE FOR LIGHT INCIDENT POSITION DETECTION

[75] Inventors: Shigenori Torihata, Isehara; Kazuto Togino, Tokyo; Akira Okamoto, Hiratsuka; Haruo Hashimoto, Kamakura; Yukitaka Takitani, Isehara; Hisaakira Imaizumi, Hiratsuka; Hiroshi Miyata, Kanagawa, all of Japan

[73] Assignee: Kabushiki Kaisha Komatsu Seisakusho, Tokyo, Japan

[21] Appl. No.: 712,997

[22] Filed: Mar. 18, 1985

[51] Int. Cl.$^4$ ............................................. H01J 40/14
[52] U.S. Cl. ................................. 250/211 J; 250/221
[58] Field of Search ................ 250/211 R, 211 J, 221, 250/229; 357/2, 30, 58, 59 B; 430/84; 340/709

[56] References Cited

U.S. PATENT DOCUMENTS

| | | | |
|---|---|---|---|
| 3,435,232 | 3/1969 | Sorensen | 250/211 J |
| 3,814,199 | 6/1974 | Jones | 250/229 |
| 3,840,741 | 10/1974 | Melchior | 250/211 J |
| 3,859,521 | 1/1975 | Connors et al. | 250/211 J |
| 4,366,377 | 12/1982 | Notthoff et al. | 250/211 J |
| 4,451,838 | 5/1984 | Yamazaki | 357/58 |
| 4,559,552 | 12/1985 | Yamazaki | 357/58 |
| 4,584,510 | 4/1986 | Hollow | 250/221 |
| 4,616,833 | 10/1986 | Geller | 250/211 |

FOREIGN PATENT DOCUMENTS 0050579 3/1984 Japan ....................... 357/2

Primary Examiner—David C. Nelms
Assistant Examiner—Stephone B. Allen
Attorney, Agent, or Firm—Handal & Morofsky

[57] ABSTRACT

The position detector comprises a semiconductor layer of i type amorphous silicon layer and a P type amorphous silicon layer is formed on one surface thereof and an N type amorphous layer is formed on the opposite surface. A transparent resistance layer is formed on one surface of the semiconductor layer. Collector electrodes are provided at the sides of the resistance layer for deriving out a position signal.

10 Claims, 21 Drawing Sheets

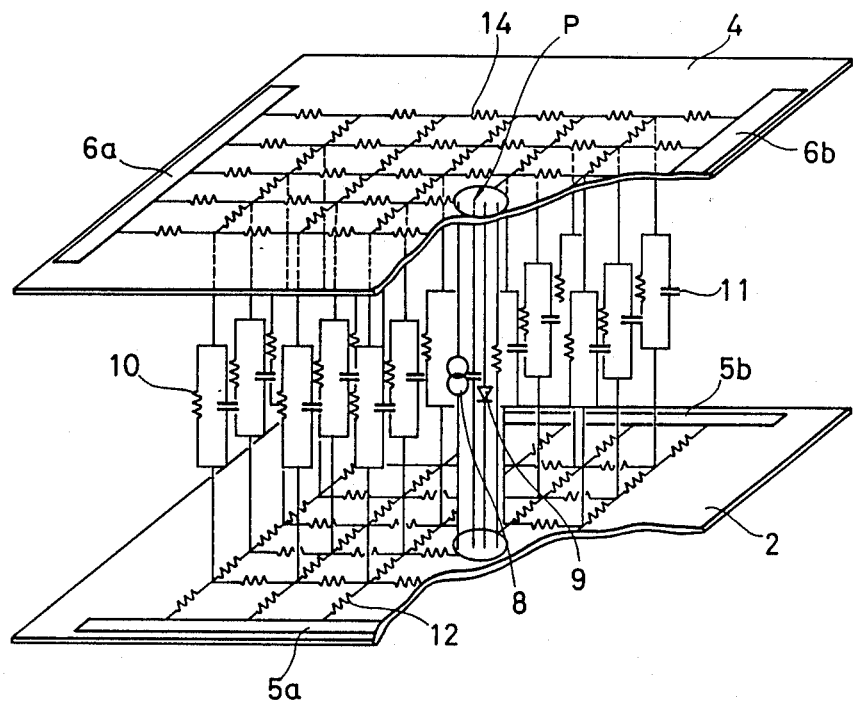

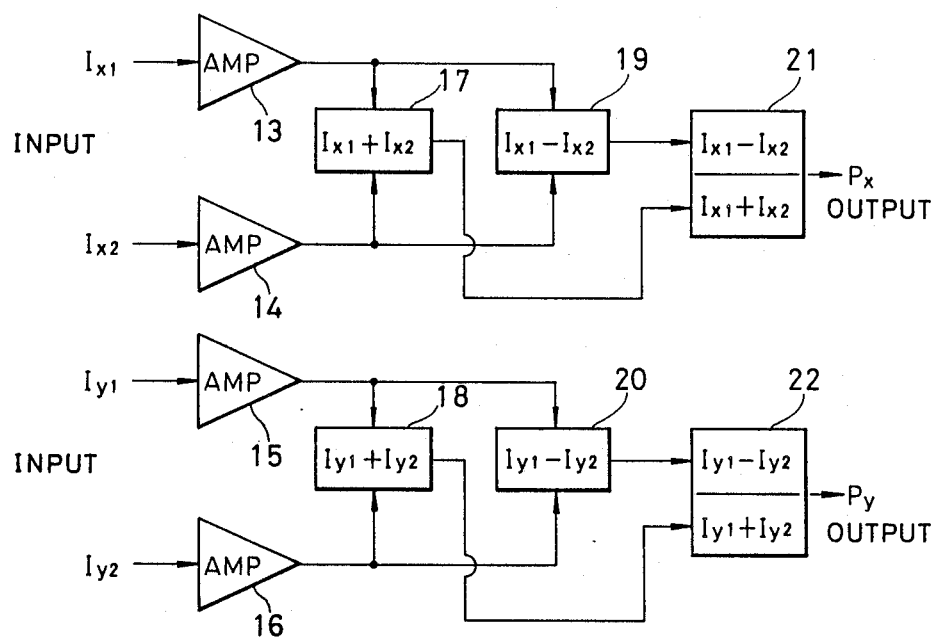
FIG. 7
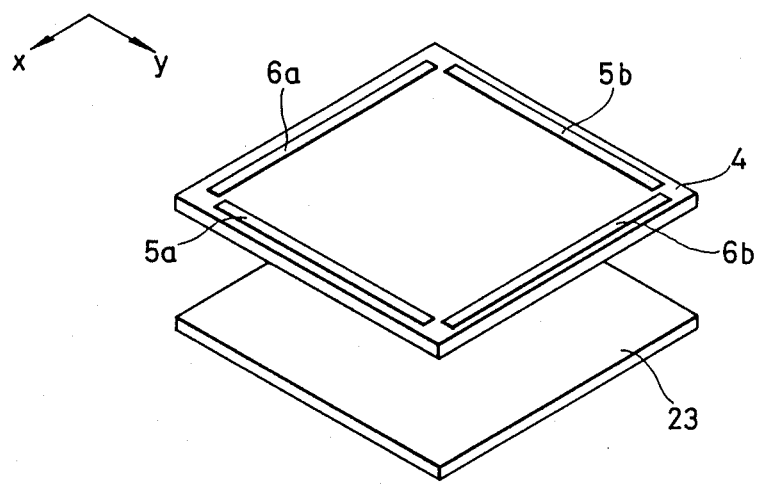

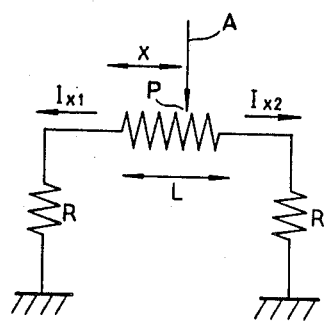
FIG.11
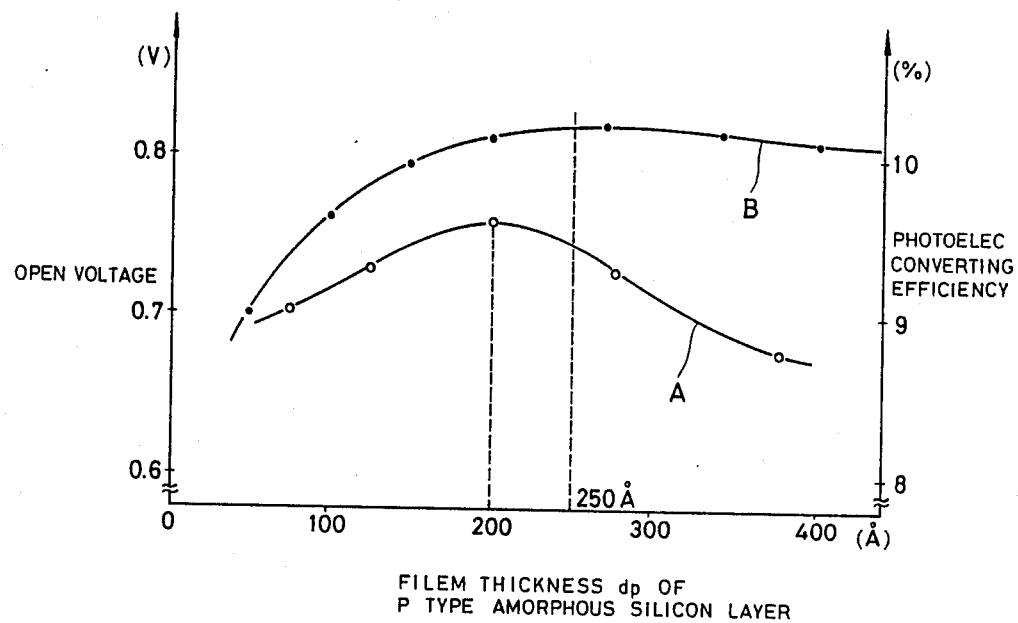
FILEM THICKNESS dp OF
P TYPE AMORPHOUS SILICON LAYER

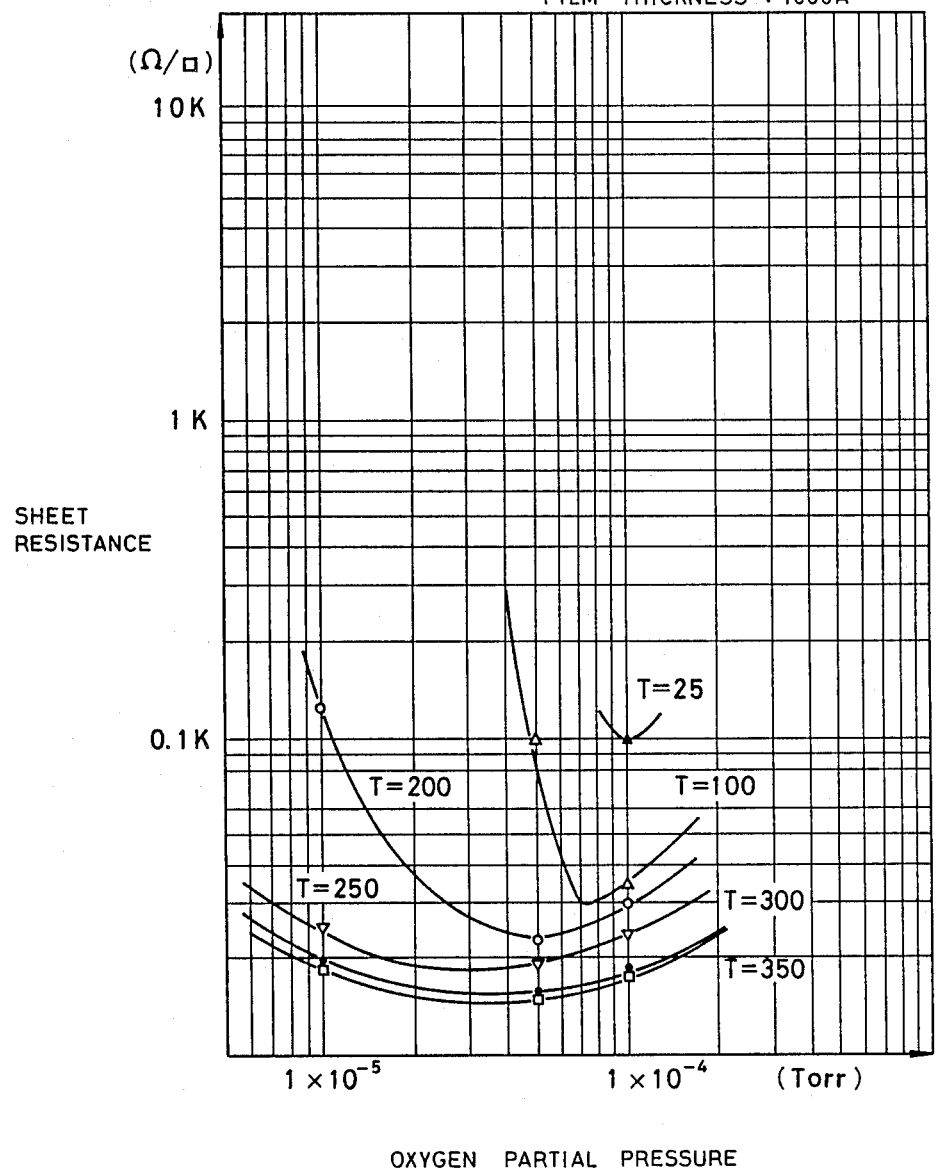

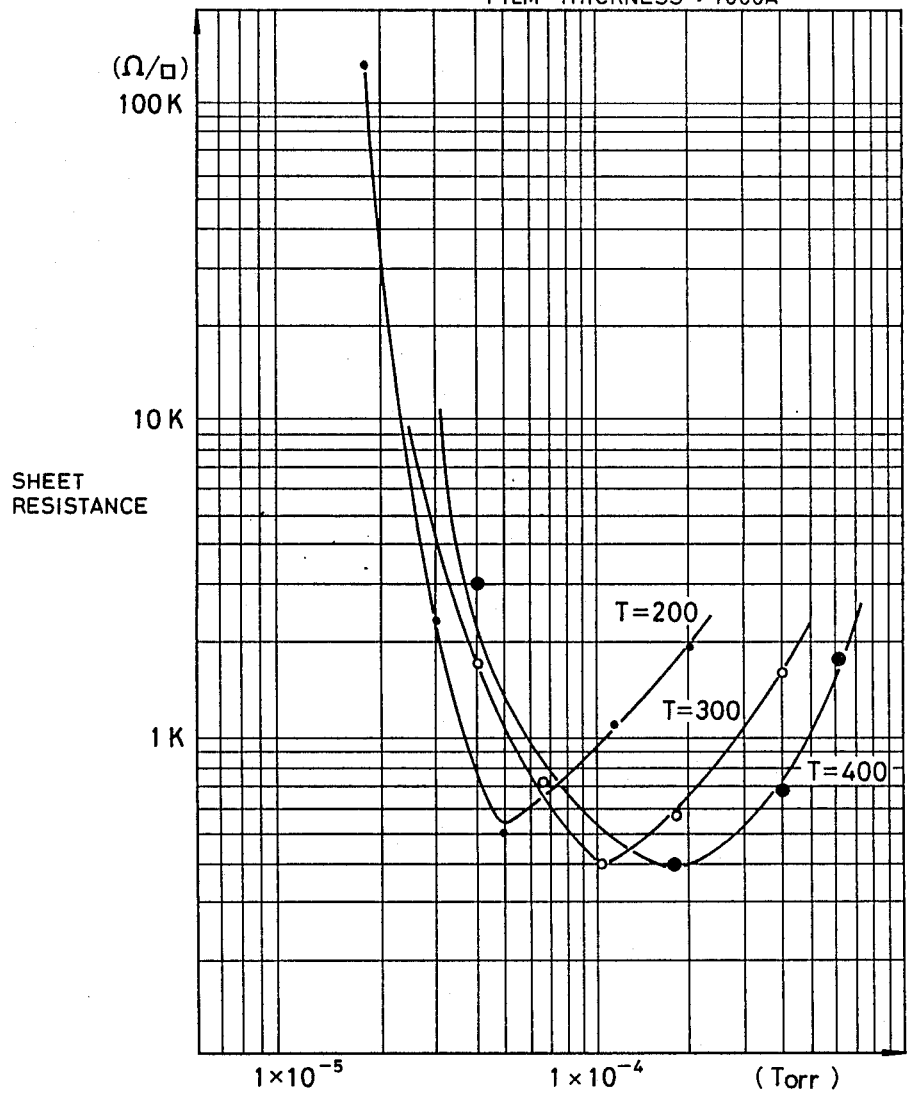

$D_p = 200$ (Å)
$d_i = 6000$ (Å)
$d_n = 400$ (Å)
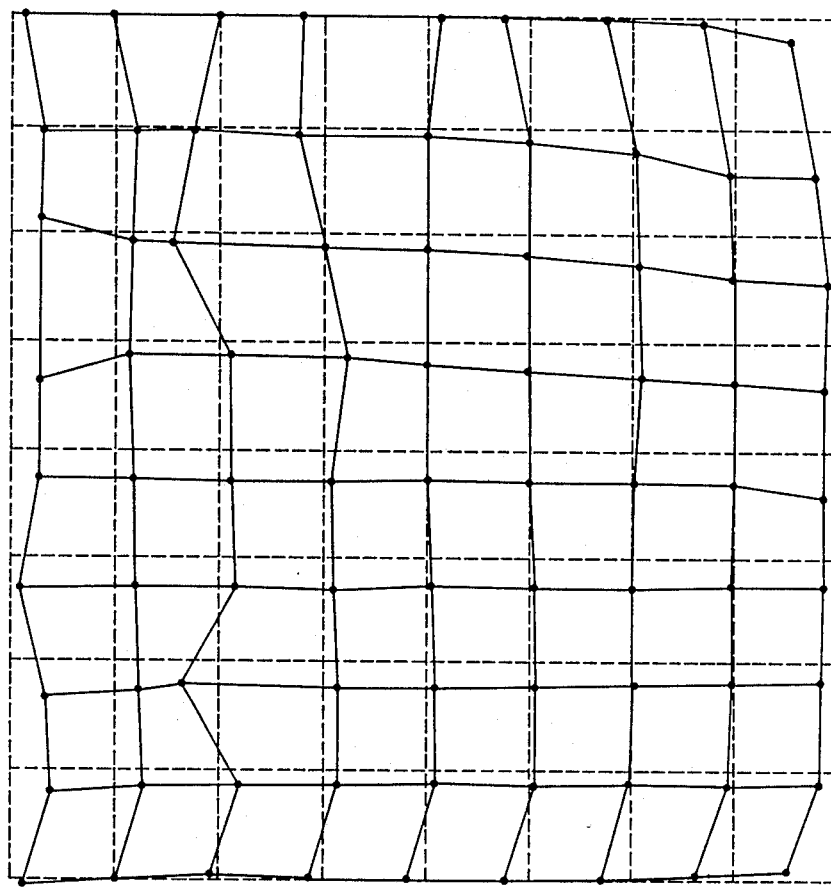

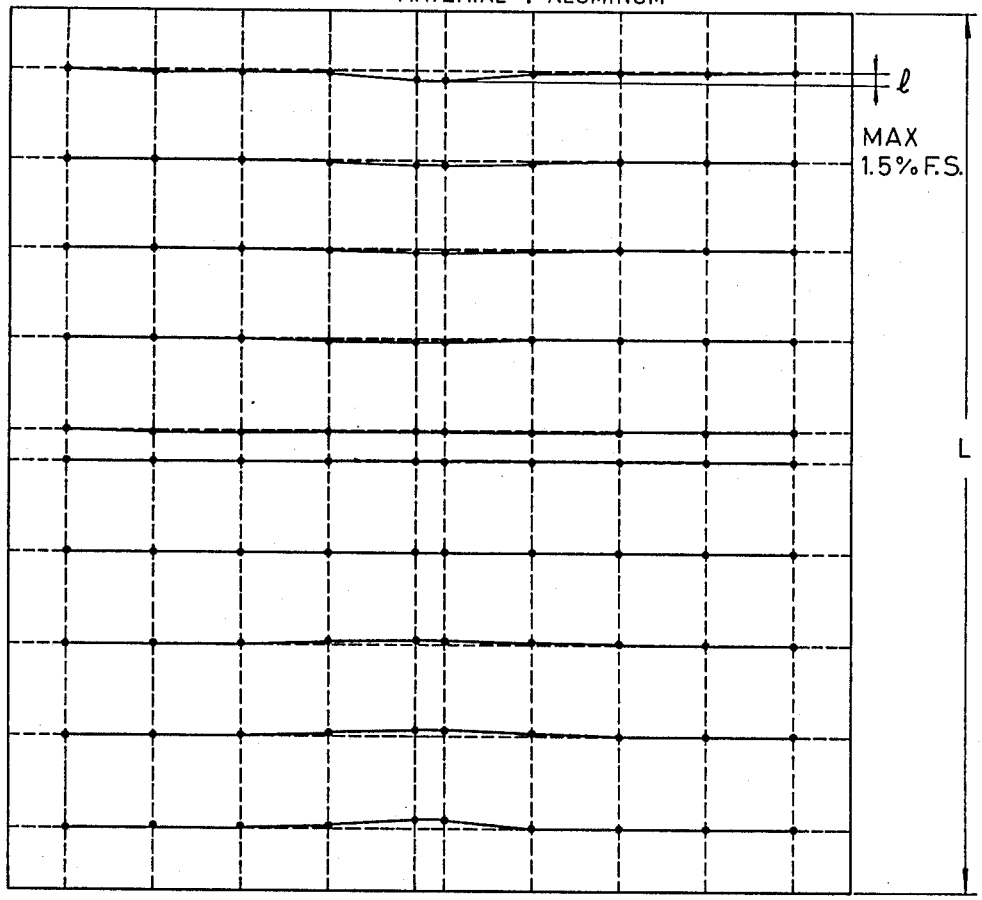

d = 10000(Å)
w = 0.8 (Cm)
l = 8 (Cm)
$\rho_s$ = 50 Ω/□

FIG.18
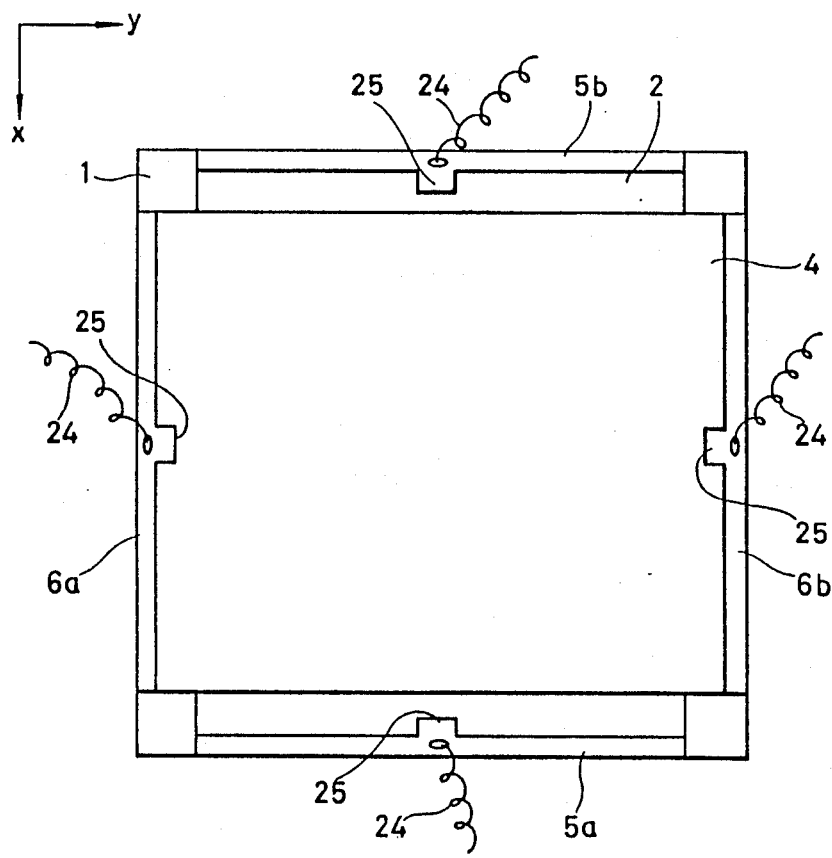
FIG.19a
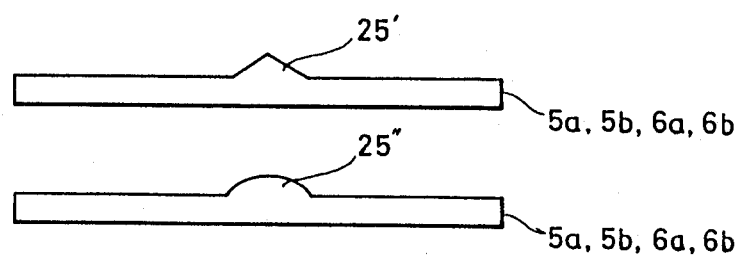
FIG.19b

SEMICONDUCTOR PHOTOELECTRIC CONVERSION DEVICE FOR LIGHT INCIDENT POSITION DETECTION

BACKGROUND OF THE INVENTION

1. Field of the Invention

This invention relates to a semiconductor position detector wherein amorphous silicon is used for a semiconductor layer performing photo-electric conversion.

2. Description of the Prior Art

In the prior art semiconductor position detector, the semiconductor layer effecting the photoelectric conversion is made of monocrystalline silicon. For example, the semiconductor layer comprises a P type silicon layer and an N type silicon layer respectively formed on the opposite surfaces of an i type silicon layer, but all of these silicon layers are made of monocrystalline silicon. The P type and N type silicon layers function as resistance layers and a collector electrode for detecting a light incident position is provided for one or both of the silicon layers.

In the prior art semiconductor position detector wherein the semiconductor layer is made of monocrystalline silicon, it has been extremely difficult to make large the light receiving area from the standpoint of manufacturing technique and economy. For this reason, in order to improve the resolution, it is necessary to provide a complicated and expensive optical system. Moreover, as the P type silicon layer and the i type silicon layer were required to have a photoelectric conversion performance and a resistance performance, it was difficult to realize a design optimum for both performances.

SUMMARY OF THE INVENTION

It is an object of this invention to provide a novel semiconductor position detector capable of readily forming a light receiving surface of a large area and improving the detection efficiency.

Briefly stated, according to this invention this object can be accomplished by forming a semiconductor layer effecting the photoelectric conversion, forming a resistance layer on at least one surface of the semiconductor layer and disposing a collector electrode which detects a position signal at one end of the resistance layer.

According to this invention, there is provided a semiconductor position detector comprising a semiconductor layer having an i type amorphous layer formed with a P type amorphous silicon layer on one surface and an N type amorphous silicon layer on the other surface, a transparent resistance layer formed on the light receiving side of the semiconductor layer, and a collector electrode formed at one side of the resistance layer for devicing out a position signal.

BRIEF DESCRIPTION OF THE DRAWINGS

Further objects and advantages of the invention can be more fully understood from the following detailed description taken in conjunction with the accompanying drawings in which:

FIG. 1b is a sectional view taken along a line Ia—Ia shown in FIG. 1a;

FIG. 1c is a sectional view taken along a line Ib—Ib shown in FIG. 1a;

FIG. 4 is a equivalent circuit of the embodiment shown in FIG. 1;

FIG. 6 is a block diagram showing one example of a processing circuit;

FIG. 7 is an exploded view showing another embodiment of this invention;

FIG. 8 is an equivalent circuit viewed in only the X direction;

FIG. 9 is a graph showing the relation between the film forming condition and the sheet resistance;

FIG. 10 is a graph showing the relation between the film forming condition and the sheet resistance;

FIG. 11 is a graph showing the relation between the P type amorphous silicon layer and the open voltage;

FIG. 12 is a graph showing the output characteristic when the P type amorphous silicon layer has a thickness of 200 Å;

FIG. 13 is graph showing the output characteristic when the amorphous silicon layer has a thickness of 400 Å;

FIG. 18 is a plan view showing a modified embodiment wherein a projection is provided for the collection electrode;

FIG. 19a and FIG. 19b are side views showing other examples of the projection;

DESCRIPTION OF THE PREFERRED EMBODIMENTS

The semiconductor position detector PS shown in FIGS. 1a, 1b, 1c and 2 comprises a substrate 1 made of glass and a resistance layer 2 made of a transparent electroconduction film and formed on the substrate by sputtering or vacuum deposition technique. A semiconductor layer 3 is formed on the upper surface of the resistance layer 2 and a resistance layer 4 made of the same material as the resistance layer 2 is formed on the upper surface of the semiconductor layer 3 by a similar method. The resistance layer has a thickness of about 1000 Å, for example.

Figure 1A:
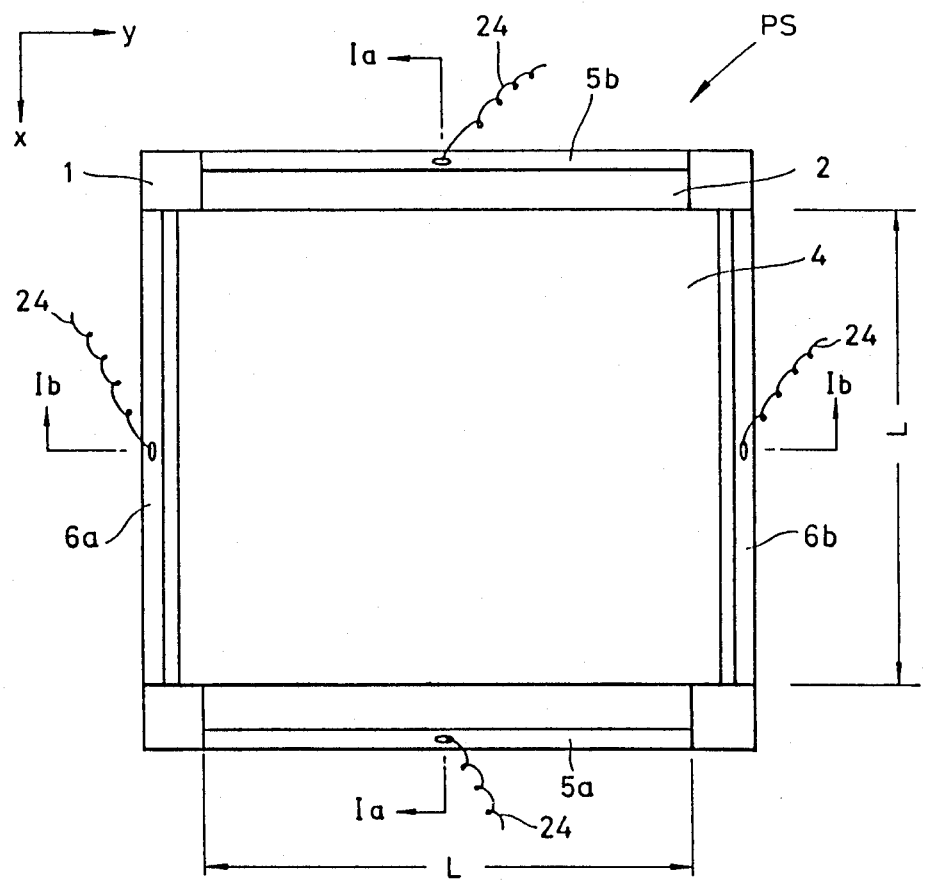
FIG. 1a is a plan view showing one embodiment of the semiconductor position detector according to this invention.
Figure 1B:
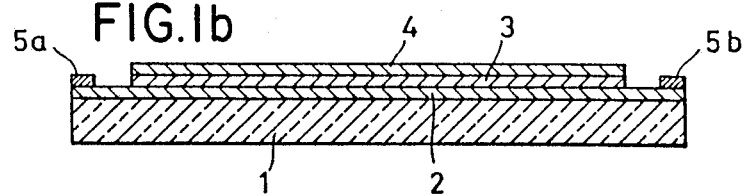
Figure 1C:
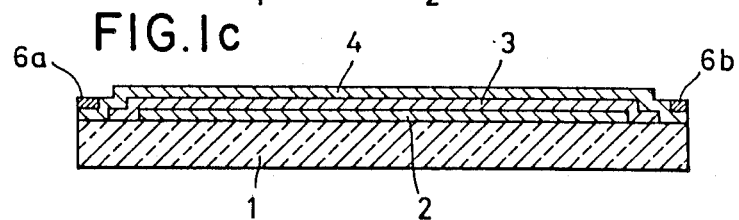
Figure 2:
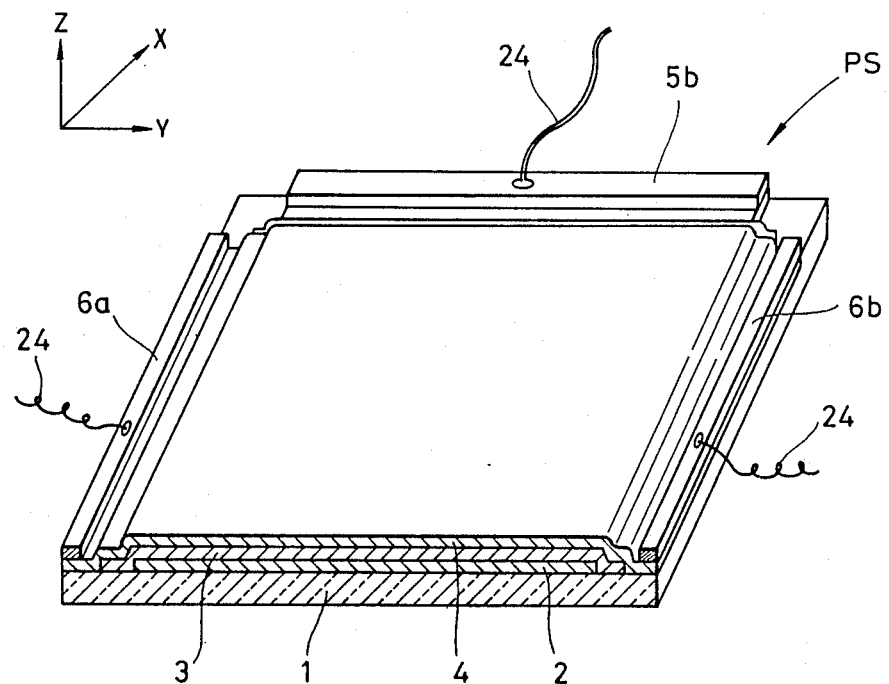
FIG. 2 is a perspective view of the semiconductor position detector shown in FIGS. 1a, 1b and 1c.
Figure 3:
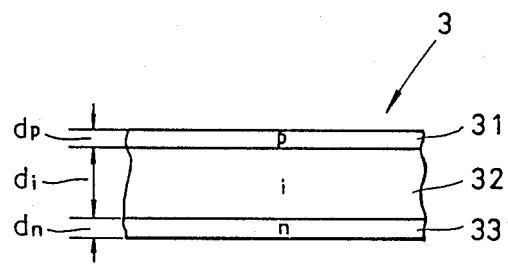
FIG. 3 is a partial enlarged view showing the construction of the semiconductor layer.

As shown in FIG. 3, the semiconductor layer 3 has a three layer construction comprising a P type amorphous silicon layer 31, an i type amorphous silicon layer 32 and an N type amorphous silicon layer 33. These layers are formed by well known chemical vapor deposition (CVD) method or the like and have thicknesses of dp=200−250 Å, di=4000−6000 Å and dn=300−500 Å, respectively.

A pair of bar shaped collector electrodes 5a and 5b extending in the x direction are disposed on the opposite sides of the resistance layer 2 to oppose each other. In the same manner, a pair of opposing collector electrodes 6a and 6b are disposed on the opposite ends of the resistance layer 4 to oppose each other in the y direction. These collector electrodes are made of aluminum or the like and formed by vapor deposition, for example.

FIG. 4 shows an equivalent circuit of the position detector of this embodiment. More particularly, at a light impinging position P, a current source 8 and an ideal diode 9 are provided between resistance layer 2 and 4. Between the resistance layer 2 and 4 except the light impinging position P are formed resistors 10 and junction capacitors 11. The resistance layers 2 and 4 are constituted by distributed resistances 12 and 14 respectively.

Figure 5A:
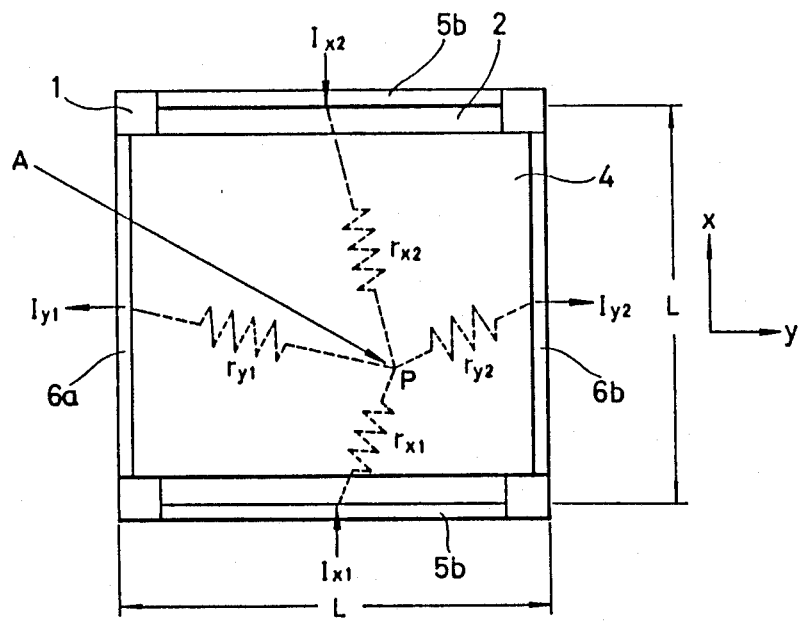
FIG. 5a, 5b and 5c are a plan view and sectional views adapted to explain the embodiment shown in FIG. 1.
Figure 5B:
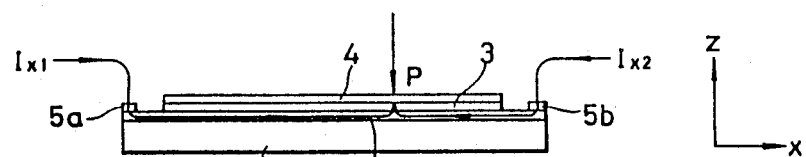
Figure 5C:
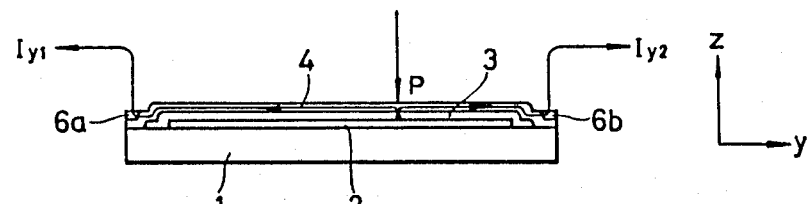

The embodiment operates as follows:

As shown in FIGS. 5a, 5b and 5c, when a light beam A impinges upon the semiconductor position detector, a photocurrent would be generated at the incident position P. In the resistance layer 2, the photocurrent is divided by resistance $r_{x1}$ and $r_{x2}$ between the incident position P and the electrodes 5a and 5b, while in the resistance layer 4, the photocurrent is divided by resistances $r_{y1}$ and $r_{y2}$ between the position P and the electrodes 6a and 6b, so that currents $I_{x1}$ and $I_{x2}$ are derived out from electrodes 5a and 5b, while currents $I_{y1}$ and $I_{y2}$ are derived out from electrodes 6a and 6b respectively.

The divided currents $I_{x1}$, $I_{x2}$, $I_{y1}$ and $I_{y2}$ are usually imputted to a signal processing circuit illustrated in FIG. 6.

The processing circuit comprises preamplifiers 13–16 inputted with the divided currents, adders 17 and 18 for producing current sums $I_{x1}+I_{x2}$ and $I_{y1}+I_{y2}$, subtractors 19 and 20 for producing current differences $I_{x1}-I_{x2}$ and $I_{y1}-I_{y2}$ respectively, and dividers 21 and 22 respectively obtaining ratios between outputs of adder 17 and subtractor 19 and between the outputs of adder 18 and subtractor 20. The dividers 21 and 22 respectively outputs a light incident position signal Px in the x direction and a light incident position signal Py in the y direction shown by the following equations (1) and (2)

$$Px = \frac{I_{x1} - I_{x2}}{I_{x1} + I_{x2}} \quad (1)$$

$$Py = \frac{I_{y1} - I_{y2}}{I_{y1} + I_{y2}} \quad (2)$$

With this processing circuit, it is possible to obtain a position signal not influenced by the intensity of the incident light and a variation thereof.

In the semiconductor position detector of this embodiment, the semiconductor layer 3 generating the photocurrent is made of amorphous silicon. Since such semiconductor layer 3 can readily be formed with such film forming technique as CVD method to have a large area, the embodiment makes it possible to obtain a light receiving surface having a larger area than the prior art position detector having a monocrystalline semiconductor layer.

More particularly, with a prior art position detector an effective light receiving area of about 10 mm² can be obtained, but with the position detector of this embodiment, an effective light receiving area of about 100 mm² can readily be obtained.

Since the position detector of this embodiment has resistance layers 2,4 independent of the semiconductor layer 3 it is possible to independently design the semiconductor layer 3 and the resistance layers 2,4 to have optimum performances, thereby increasing the sensitivity.

Since in the prior art position detector utilizing monocrystalline silicon, the semiconductor layer is made to have a performance of a resistance layer, in other words, since an independent resistance layer is not provided, in practice it is impossible to design a position detector having maximum performances of generating the photocurrent and acting as the resistance layer.

In the embodiment described above, the substrate 1 is made of glass and the resistance layer 2 is made of a transparent conductive film. Thus, according to this embodiment, even when a light beam is caused to impinge upon one side of the substrate, the light beam impinging position can readily be detected. In other words, in the position detector of this invention the incident position of the light beam can be detected regardless of the surface of the semiconductor layer onto which the light beam impinges. Where the resistance layer 4 is formed only on the light receiving side, the resistance layer 4 and the substrate 1 may be formed of light intercepting or opaque material. Further, since one side of the substrate 1 receives the light, the resistance layer 2 may be made of light intercepting material.

Although in the foregoing embodiment, pairs of electrodes 5a, 5b and 6a, 6b are provided respectively for resistance layers 2 and 4 as shown in FIG. 1, if desired, all electrodes may be provided for the resistance layer 4, for example, as shown in FIG. 7. In this case, however, a common electrode 23 in the form of an electroconductive layer is substituted for the resistance layer 2.

In the embodiment described above, the resistance layer was formed on the N type layer side of the semiconductor 3, and the resistance layer 4 was formed on the P type layer side, but the positions of the N type and P type layers may be reversed.

Let us consider the resistance layers 2 and 4, and in FIG. 5 the position detection in only the x direction will be considered. Let us denote the distance between electrodes 5a and 5b by L, the load resistances connected to electrodes 5a and 5b by R, and the distance between the light incident portion P and the electrode 5c by x. Then an equivalent circuit shown in FIG. 8 can be obtained.

In this equivalent circuit, the divided currents $I_{x1}$ and $I_{x2}$ can be expressed as follows according to Kirchhoff's law.

$$I_{x1} = \frac{(L-x)\rho + R}{(L-x)\rho + R + x\rho + R} \cdot I_x \quad (3)$$

$$I_{x2} = \frac{x\rho + R}{(L-x)\rho + R + x\rho + R} \cdot I_x \quad (4)$$

where $\rho$ represents the resistivity of the resistance layer 2.

Substituting $I_{x1}$ and $I_{x2}$ in equation (1), we obtain;

$$P_x = \frac{1 - 2(x/L)}{1 + 2(R/r)} \quad (5)$$

where r represents the resistance between electrodes 5a and 5b and expressed as $r = \rho \cdot L$ Equation (5) shows that the smaller is (R/r), the larger is the position signal output $p_x$.

To make small R/r, R is made small or r is made large. But in view of the construction of the processing circuit, it is impossible to make small the load resistance R. For this reason, in order to obtain a large position signal output $P_x$, the resistance value r of the resistance layer 2 must be increased. The same is true for the position signal output $P_y$.

FIG. 9 shows the relationship between the oxygen partial pressure and the sheet resistance wherein the substrate temperatures are used as parameters and a resistance layer made of indium-tinoxide (ITO) and having a thickness of about 1000 Å is formed with sputtering method. In order to obtain a resistance layer having a predetermined sheet resistance at a high reproduceability, it is necessary to form the resistance layer under an oxygen partial pressure resulting in a gradual variation in the resistance value so that where ITO is used, the resistance will have a value of about several tens ohm/square as can be noted from FIG. 9.

From the standpoint of practical use, the sheet resistance of the resistance layers 2 and 4 may be about several tens ohm/square. However, in order to increase the position signal output, that is, the position detection sensitivity, it is desirable to further increase the sheet resistance of the resistance layers 2 and 4. To this end, it is preferable to fabricate the resistance layers 2 and 4 with a material consisting essentially of tin oxide($SnO_2$). More particularly, as shown in FIG. 10, where the resistance layers 2 and 4 are made of material consisting essentially of tin oxide, it is possible to make the sheet resistance of the resistance layers 2 and 4 to be about several hundred ohms/square. Thus, it is possible to greatly improve the detection sensitivity than that of a resistance layer made of ITO. As the detection sensitivity is improved, the S/N ratio can also be improved.

Where the resistance layers 2 and 4 are made of material consisting of 100% tin oxide, the resistance value becomes infinity so that it is advantageous to use a mixture of tin oxide and suitable quantity of impurity, for example, antimony as the material for preparing the resistance layers.

The sheet resistance can be increased by decreasing its thickness. For example, when the thickness (1000 Å) is reduced to be less than 1/10, a sheet resistance of several hundreds ohms/square can be obtained. However, since the reproduceability of this method is low, its practical value is low.

Let us now consider the film thickness dp of the P type amorphous silicon layer 31 shown in FIG. 3.

As shown by curve A in FIG. 11, the photoelectrode conversion efficiency of the semiconductor layer 3 becomes a maximum at about $dp \approx 200$ Å. For this reason, where the photoelectric conversion efficiency is important, dp is set to about 200 Å. Considering the position detection accuracy, it is desirable to set dp to a value at which the open voltage (a voltage at which the density of the current formed by light becomes zero) saturates.

Where the P type amorphous silicon layer 21 is formed by CVD method, the film thickness would not be uniform due to turbulent flow of gas used in the CVD method. Accordingly, even when the P type layer 31 is formed so as to make $dp \approx 200$ Å, the film thickness of a portion of the layer 31 becomes smaller than 200 Å.

As can be noted from curve B in FIG. 11, when the open voltage (a voltage at which the density of the current formed by light becomes zero) becomes saturated when dp exceeds a certain value (in the example shown, larger than 250 Å) and in the region below 25 Å, the open voltage varies with the value of dp.

For this reason, it is desired to obtain a target film thickness (for example dp=200 Å) in a region in which the open voltage does not saturate, but becomes nonuniform due to the nonuniformity of the film caused by the film forming apparatus.

When the open voltage becomes nonuniform, redistribution of carriers occurs in the semiconductor layer for the purpose of alleviating the nonuniformity of the open voltage, so that the position detection accuracy decreases as shown by examples shown in FIG. 12. In FIG. 13, dotted lines show light beam incident points, while solid lines actual detection positions of the semiconductor position detector of this embodiment.

When the film thickness dp is set to a value larger than 250 Å in a region in which the open voltage saturates, the dependency of the open voltage upon the film thickness dp decreases, thus minimizing the decrease in the position detection accuracy caused by the nonuniformity of the film thickness. For example, where the film thickness dp is set to 300 Å, the detection accuracy can be improved as shown in FIG. 13 in which the detection error is depicted in %. Thus, the error is shown by percentage by representing the full scale L by 100.

The collector electrodes 5a, 5b and 6a, 6b will now be considered.

In the prior art position detector utilizing monocrystalline silicon, since the resistance layer itself acts as the resistance layer, the resistance value of the resistance layer is high (for example 1kΩ) so that the resistance value of the collector electrode does not effect greatly upon the detection accuracy.

Figure 14:
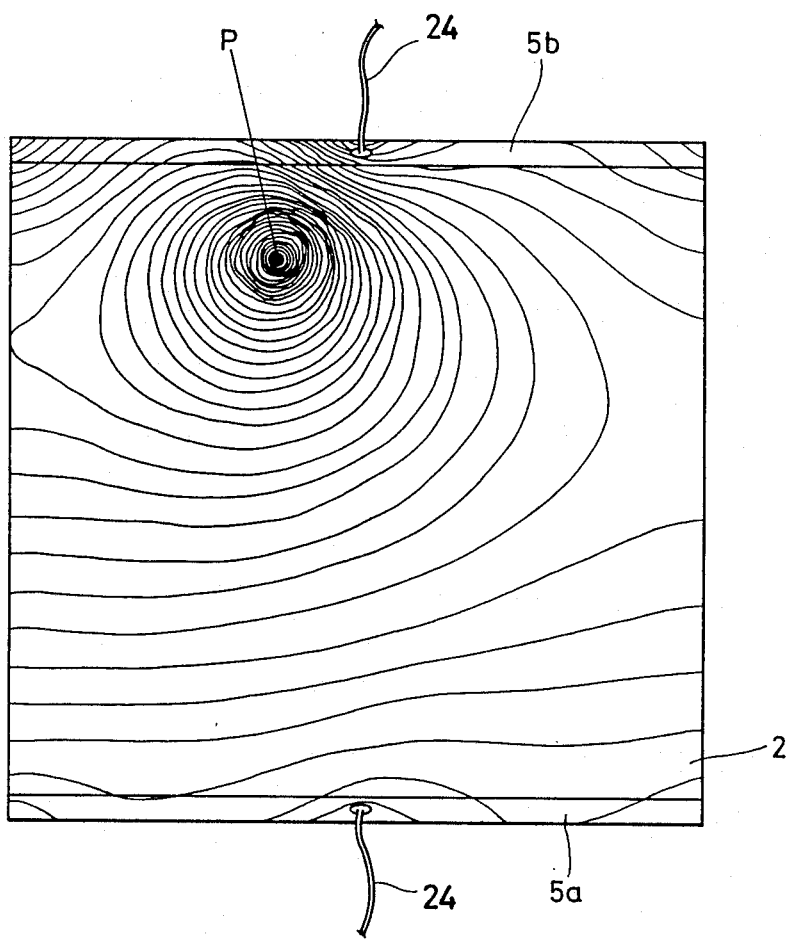
FIG. 14 shows a potential distribution about a conductive electrode.

In contrast, since the resistance layers 2 and 4 of the above described embodiment are made of ITO, their resistance is extremely low λ for examples 50 Ω). Accordingly, when the resistance of the collector electrodes 5a, 5b, 6a and 6b is high, these electrodes will have a potential distribution as shown in FIG. 14 when a photocurrent flows through the resistance layers 2 and 4, which decreases the detection accuracy. For this reason, in order to improve the detection efficiency, it is necessary to decrease as far as possible the resistance value of the collector electrodes 5a, 5b, 6a and 6b.

Figure 15:
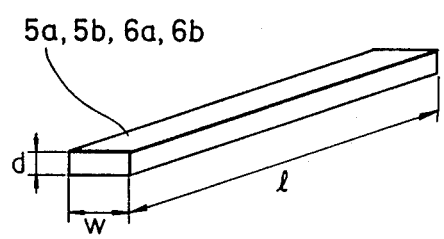
FIG. 15 is a perspective view showing the configuration of a collector electrode.
Figure 16:
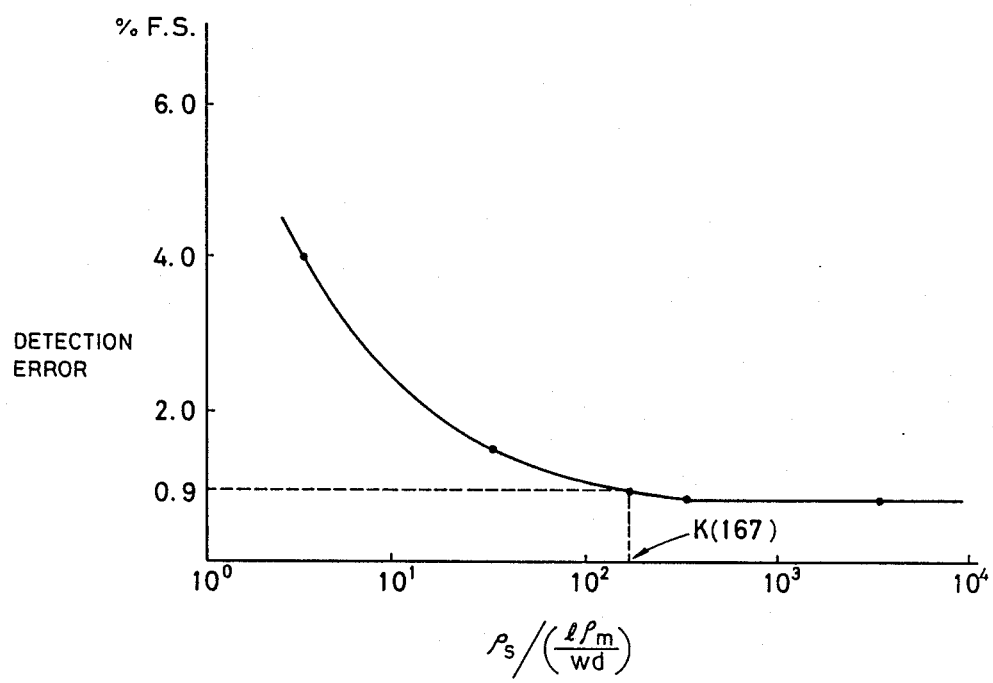
FIG. 16 is a graph showing the relation between the detection error and the ratio of the resistance of a resistance layer to the resistance of the collector electrode.

As shown in FIG. 15, let us denote the thickness of the collector electrodes by d, their width by w, length by l, the resistivity of the material by ρm, and the sheet resistance of the resistance layers 2 and 4 by ρs. Then, a relation is as shown in FIG. 16 between the ratio $$\rho s / \frac{l\rho m}{wd}$$

between the sheet resistance and the resistance of the collector electrodes. In other words, as the ratio $$\rho s / \frac{l\rho m}{wd}$$

increases, the detection accuracy is improved. When the ratio $$\rho s / \frac{l\rho m}{wd}$$

exceeds a certain value (experimental value: 167) the detection accuracy becomes a substantially constant value.

Figure 17:
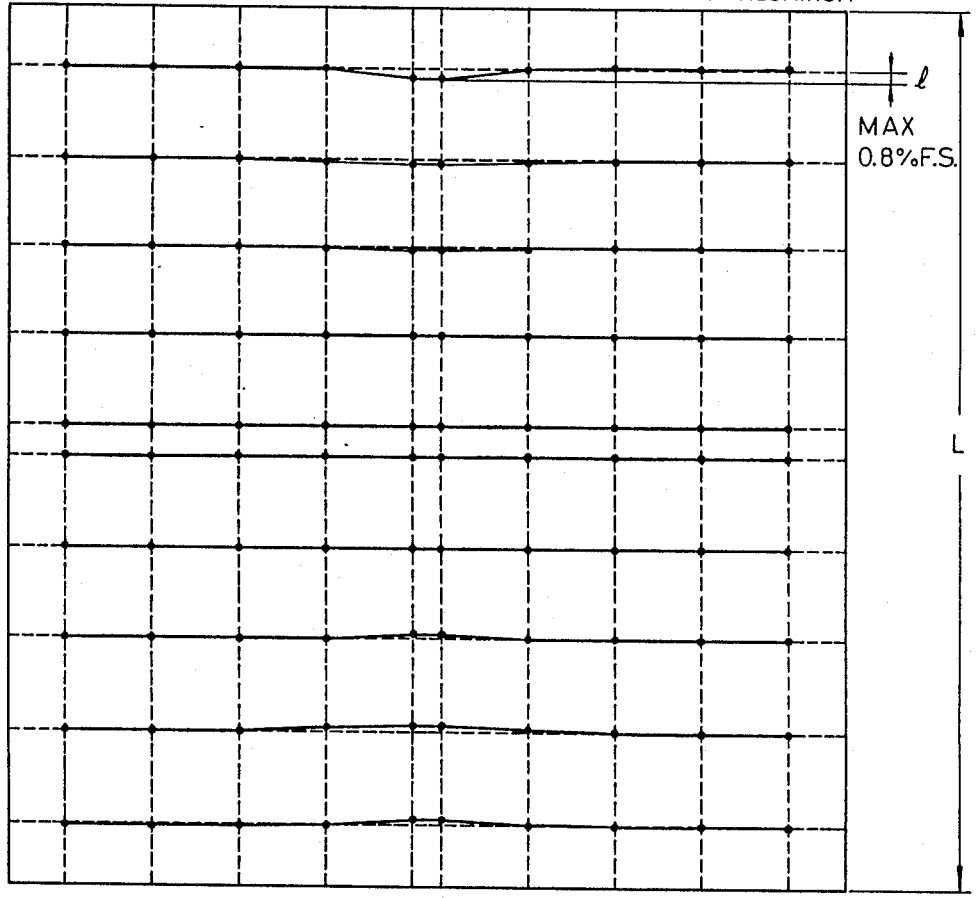
FIG. 17 is a graph showing the improvement of the detection accuracy when the ratio between the resistance of the resistance layer and that of the collection electrode is adequately determined.

Thus, it will be clear that the detection accuracy can be improved by selecting parameters d, w, l and φm such that the ratio $$\rho s / \frac{l\rho m}{wd}$$

would become larger than the value K. FIG. 13 shows the output characteristic when the parameters are selected such that d=3000 Å, w=0.8 cm, l=8 cm and aluminum (φm=2.65×10⁻⁶ ohm·cm) is used. But when the ratio $$\rho s / \frac{l\rho m}{wd}$$

is made to be larger than K with the same parameters except selecting d=1000 Å, an excellent output characteristic as shown in FIG. 17 can be obtained. In other words, it is possible to decrease the detection error to about one half. The characteristics shown in FIGS. 13 and 17 were obtained when ρs=50 ohm/square and in these figures the detection errors l/L (%) in only the x direction are shown.

As shown in FIG. 1, the collector electrodes 5a, 5b, 6a and 6b are connected to lead wires 24. The position detection currents collected by these collector electrodes are derived out through lead wires so that currents concentrates at the joints of these wires. In other words, the current density differs at the joints and the other portions of the lead wires.

In FIG. 17, it is considered that the detection error l is mainly caused by the potential distribution about the collector electrodes due to the current concentration at the joints of the lead wires. As a result of exhaustive experiments, I have formed that the detection error l/L can be decreased by forming projections 25 near the joints of the lead wires of the collection electrodes 5a, 5b, 6a and 6b.

The projections provided for the collector electrodes 5a and 5b are formed to project towards the central portion of the resistance layer 2, and the lower surfaces of the projections are in contact with the lower surface of the resistance layer. On the other hand, the projection 26 provided for the collector electrodes 6a and 6b are formed to project toward the central portion of the resistance layer 4 and the lower surfaces of the projections 26 are in contact with the lower surface of the resistance layer 4.

Although the projections 25 shown in FIG. 18 are square, the projections may be triangular projections 25' as shown in FIG. 19a or arcuate projections 25" as shown in FIG. 19b.

Figure 20:
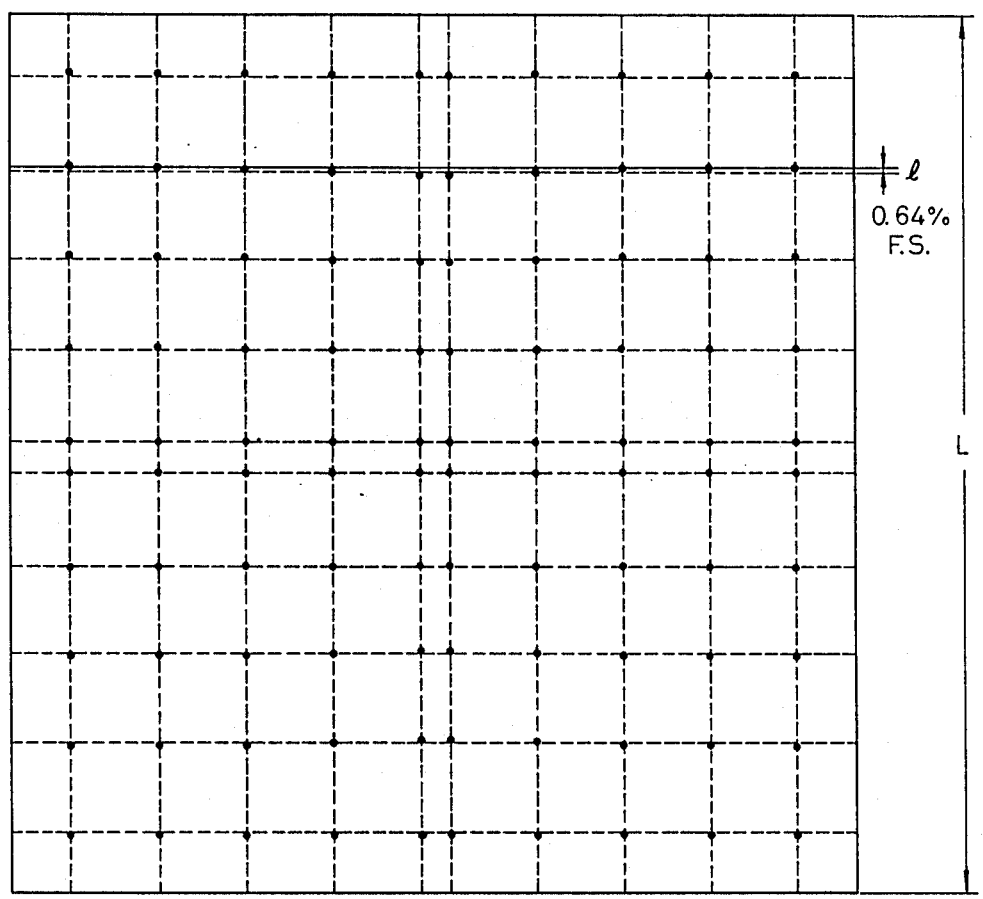
FIG. 20 is a graph showing improvement of the detection accuracy where a collection electrode is formed with a projection.

When projections 25, 25' or 25" are provided, it is possible to decrease the detection error l/L to about 0.64% as shown in FIG. 20. In FIG. 20, too, the detection error only in the x direction is shown.

Figure 21:
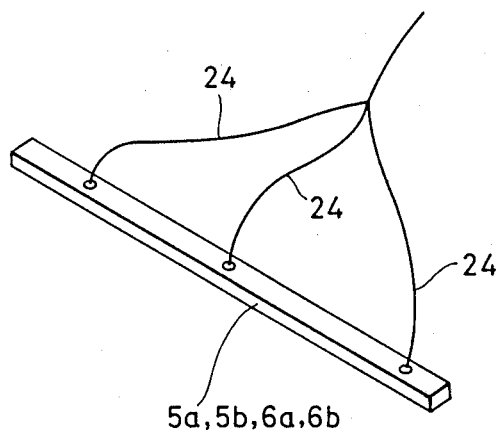
FIG. 21 is a perspective view showing a collector electrode connected with a plurality of lead wires.
Figure 22:
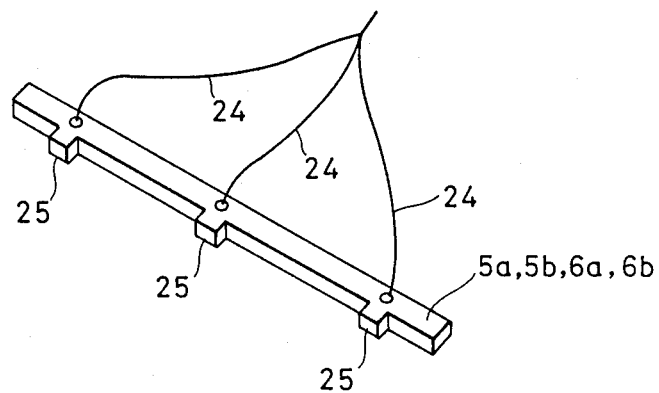
FIG. 22 is a perspective view showing a collector electrode provided with a plurality of lead wires and projections.

To prevent current concentration at the collector electrodes 5a, 5b, 6a and 6b, the following methods may be used. More particularly, the current can be dispersed when a plurality of (3, for example) spaced lead wires are connected to each collector electrode as shown in FIG. 21. With this method, the detection error l/L can be reduced to about 0.44%. In another example shown in FIG. 22, a plurality of lead wires 24 are respectively connected to the projections 25.

Figure 23:
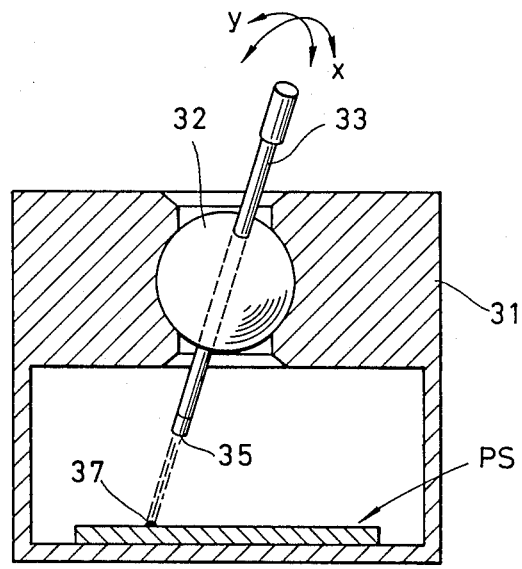
FIG. 23 is a sectional view showing one example of a joy stick utilizing the semiconductor position detector embodying the invention.
Figure 24:
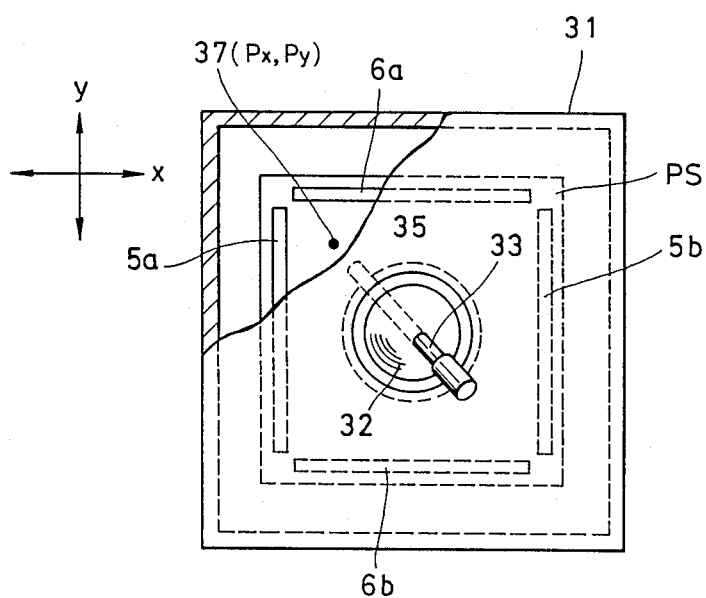
FIG. 24 is a plan view of the joy stick and the semiconductor position detector shown in FIG. 23.

The semiconductor position detector according to this invention can be used in various applications. FIGS. 23 and 24 show an application of the position detects to a joy stick utilized in an input device of a computer or the like.

The joy stick shown in FIGS. 23 and 24 is constituted by a casing 31 made of opaque material, a lever 33 rotatably supported at the upper center of the casing 31 through a ball 32, a light source 35, a luminous diode, for example, mounted on the lower end of the lever, and a semiconductor position detector PS disposed on the bottom surface of the casing 1.

After connecting the position detector PS to the signal processing circuit shown in FIG. 6, when the lever 33 is operated the light beam incident position that is the position of a light point 37 with respect to the semiconductor position detector PS would vary so that position signals $P_x$ and $P_y$ representing the positions $P_x$ and $P_y$ of the light point 37 in the x and y directions are outputted from the signal processing circuit.

Figure 25:
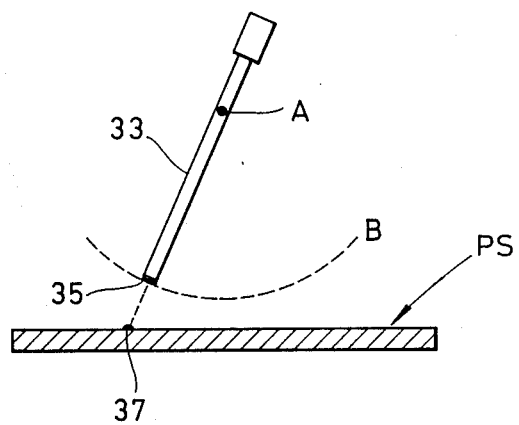
FIG. 25 shows a manner of swinging a light source.

As shown in FIG. 25, the lever 33 of the joy stick swings about a pivot point A (the center of the ball 2) so that the loci of the movement of the light source 35 is accurate and there is no proportional relation between the swinging angle of the lever 33 and the output of the position detector.

Figure 26:
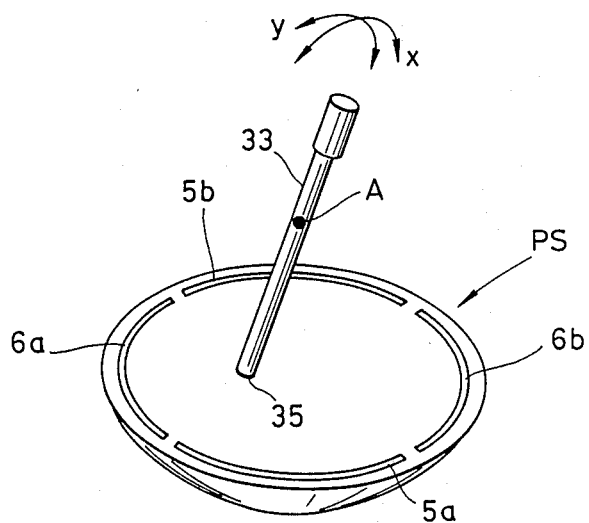
FIG. 26 is a perspective view showing a joy stick using a rectangular position detector.

Accordingly, to establish a proportional relation between the swinging angle and the output of the position detector, the semiconductor position detector PS is formed to have a radius of curvature the same as that of the loci B of the light source 35 and the detector PS is positioned with its center of the radius of curvature coincided with the center A of swinging as shown in FIG. 26.

Figure 27:
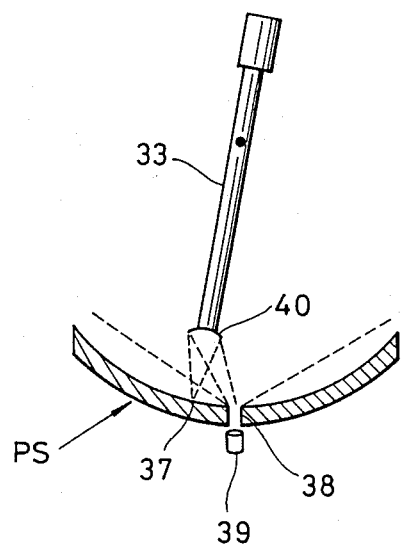
FIG. 27 is a diagrammatic view in which the light source is disposed on the side of the position detector.

In the joy stick shown in FIG. 26, the light source 35 is mounted on the lower end of the lever 33, but in the modification shown in FIG. 27, a pin hole 38 is formed at the center of the semiconductor detector PS, a light source 39 is positioned immediately beneath the pin hole 38, and a concave mirror 40 is connected to the lower end of the lever 33. With this construction, since the light emitted by the light source 19 impinges upon the convex mirror 40 through the pin hole 28, the light reflected by the convex mirror 40 would be focused on the semiconductor position detector PS to form a light point 37. The convex mirror 40 is disposed such that its optical axis will concide with the axis of lever 33 and that its focus will be formed on the position detector PS. In the joy stick shown in FIG. 27 since the light source 37 is provided on the side of the position detector PS, it is not necessary to provide wirings for lighting the light source on the lever 33, whereby the construction can be simplified and the durability can be improved.

Figure 28:
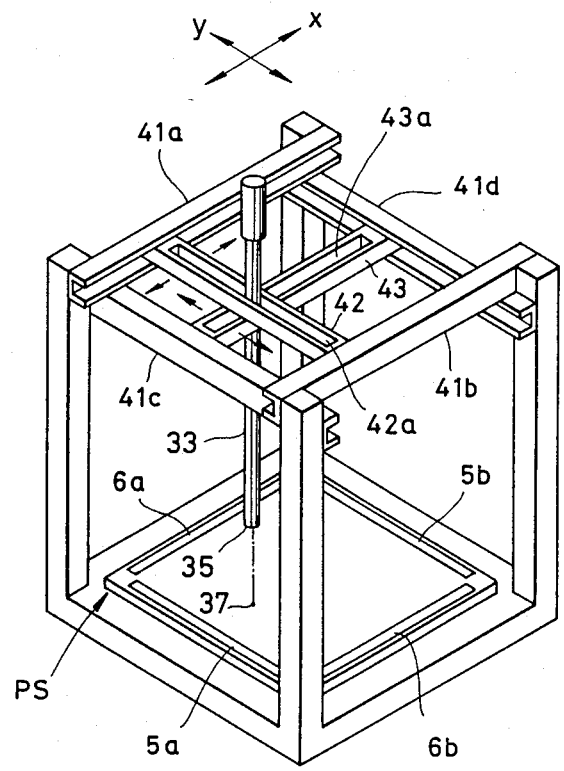
FIG. 28 is a perspective view of a joy stick in which levers are moved in parallel in X and Y directions.

A modified joy stick shown in FIG. 28 comprises opposed guide rails 41a and 41b spaced in the x direction, opposed guide rails 41c and 41d spaced in the y direction, a movable member 42 slidable in the x direction with both ends guided by guide rails 41a and 41b, another movable member 43 sliding in the y direction with both ends guided by the guide rails 41c and 41d and a flat semiconductor position detector PS at the bottom.

Figure 29:
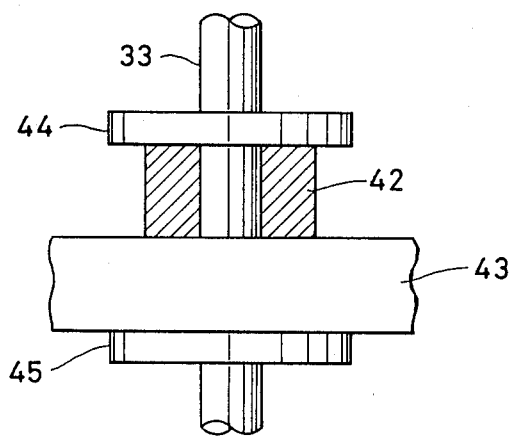
FIG. 29 is a side view, partly in section showing a supporting structure of a lever shown in FIG. 28.

The movable members 42 and 43 are formed with through guide slots 42a and 43a extending in the x and y directions respectively and a vertical lever 33 extending through the cross-point of the slots 42a and 43a. For the purpose of preventing vertical movement of the lever 33 two flanges 44 and 45 are provided to respectively engage the upper surface of the movable member 42 and the lower surface of the movable member 43 respectively as shown in FIG. 29.

With this modification, since the lever 33 can freely move in the x and y directions always normal to the semiconductor position detector PS, there is an advantage that it is possible to visually know the quantity inputted by the operation of the lever.

Figure 30:
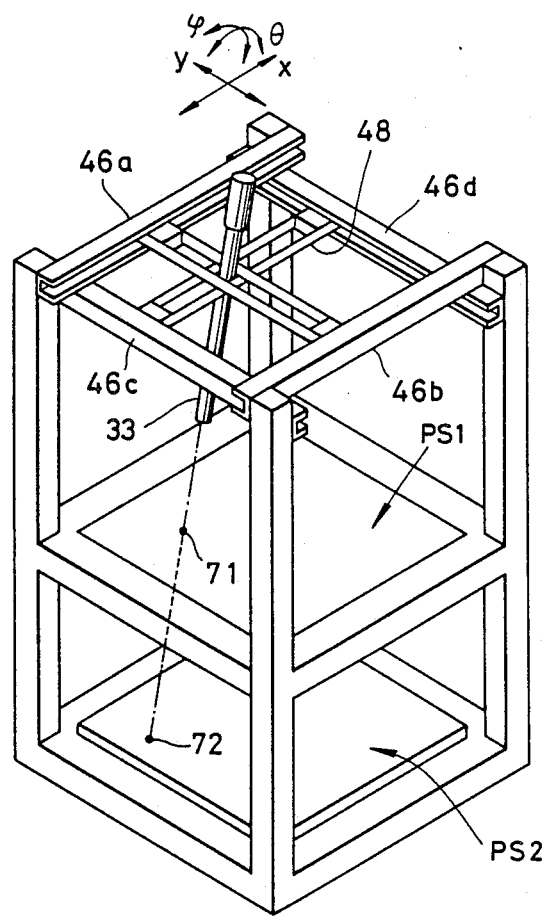
FIG. 30 is a perspective view showing the construction of a 4 value input type joy stick.
Figure 31:
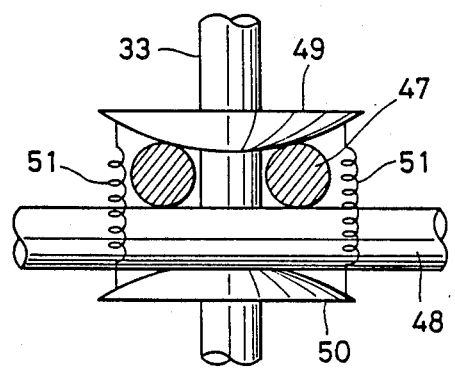
FIG. 31 is an enlarged side view showing the supporting structure of the lever shown in FIG. 30.

In still another modification of the joy stick shown in FIG. 30, there are provided guide rails 46a–46d and movable members 47 and 48 disposed in the same manner as the guide rails 41a–41d and movable members 42 and 43 shown in FIG. 28. As shown in FIG. 31, the movable members take the form of round rods so that these movable members engage with the lever 33 with point contacts. A curved flange 49 is secured to the lever 33 and a washer having the same curved surface is provided to loosely pass the lever 33, the lower surface of the flange 49 is urged against the guide member 48 by springs 51. As a consequence, the lever 33 can freely move and tilt without dropping off.

In the embodiment shown in FIG. 30, two parallel semiconductor position detectors PS1 and PS2 are disposed beneath the lever 33. At least one of the detectors PS1 utilizes transparent material such as glass for the substrate 1 and transparent material for the resistance layer 2 as shown in FIG. 1. For this reason the detector PS1 transmits a light beam.

In the joy stick shown in FIG. 30 the lever can move freely in the x and y directions and can freely tilt in the direction of $\theta$ and $\phi$. The light beam emitted from the light source 35 at the lower end of the lever 33 forms a light point or spot 71 on the semiconductor position detector PS1 and after passing through the position detector PS1, the light beam forms a light point 72 on the lower semiconductor position detector PS2. Consequently, the positions of the light points or spots 71 and 72 are determined by the position and inclination angle of the lever 33.

Consequently, the position of the pivot point of the lever in the x and y directions can be determined by determining the positions of the light points 71 and 72 based on the output signals of the semiconductor position detectors. It is also possible to determine the inclination angles of the lever 33 in the $\theta$ and $\phi$ directions based on the positions of the light points 71 and 72. Thus this joy stick acts as a joy stick of the four value input type.

Various modifications in structure and/or function may be made to the disclosed embodiments by one skilled in the art without departing from the scope of the invention as defined by the claims.

What is claimed is:

1. A semiconductor photoelectric conversion device device for light incident position detection comprising:
    a PIN amorphous semiconductor layer structure comprising a P type amorphous semiconductor layer, an I type amorphous semiconductor layer and an N type amorphous semiconductor layer;
    first and second resistance layers provided on opposing surfaces of said structure;
    a pair of first collector electrodes provided on said first resistance layer, said first collector electrodes opposing to each other in a first direction; and
    a pair of second collector electrodes provided on said second resistance layer, said second collector electrodes opposing each other in a second direction perpendicular to said first direction,
    wherein at least one of said first and second resistance layers at which light incidents is made to be light permeable.

2. A semiconductor photoelectric conversion device for light incident position detection comprising;
    a PIN amorphous semiconductor layer structure comprising a P type amorphous semiconductor layer, an I type amorphous semiconductor layer and an N type amorphous semiconductor layer;
    a resistance layer provided on one of opposing surfaces of said structure;
    a conductive layer provided on another of said opposing surfaces of said structure, said conductive layer forming a common electrode;
    a pair of first collector electrodes provided on said resistance layer, said first collector electrodes opposing to each other in a first direction; and
    a pair of second collector electrodes provided on said resistance layer, said second collector electrodes opposing to each other in a second direction perpendicular to said first direction,
    wherein at least one of said resistance layer and said conductive layer at which light incidents is made to be light permable.

3. The device according to claim 1 wherein said P type amorphous silicon layer has a thickness such that an open voltage thereof will saturate according to a relation between said thickness and said open voltage.

4. The device according to claims 1 or 2 wherein said collector electrodes have a length l, resistivity $\rho m$, width w and thickness d said length, resistivity, with end thickness are selected such that a ratio $$\rho s / \frac{l\rho m}{wd}$$

(where $\rho s$ represents a sheet resistance of said resistance layer) has a value in a region in which a position detection accuracy has a substantially constant value.

5. The device according to claims 1 or 2 wherein each of said collection electrode has a projection near a point where a lead wire is connected, said projection projecting towards inside of said resistance layer.

6. The semiconductor position detector as defined in claims 1 or 2, including a joystick comprising a lever including means for projecting a light beam upon said device, and means for supporting said lever such that an incident position of said light beam upon said device would be changed when said lever is operated.

7. The device according to claim 1 wherein at least one or both of said resistance layers is made of a material consisting essentially of tin oxide.

8. The device according to claim 1 wherein at least one of both of said resistance layers is made of a material comprising tine oxide.

9. The device according to claim 2 wherein the resistance layer is made of a material comprising tin oxide.

10. The device according to claim 2 wherein the resistance layer is made of material consisting essentially of tin oxide.

* * * * *